United States Patent
Kobayashi

(10) Patent No.: US 6,806,532 B2
(45) Date of Patent: Oct. 19, 2004

(54) NONVOLATILE SEMICONDUCTOR DEVICE

(75) Inventor: Kiyoteru Kobayashi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 09/908,848

(22) Filed: Jul. 20, 2001

(65) Prior Publication Data

US 2002/0079547 A1 Jun. 27, 2002

(30) Foreign Application Priority Data

Dec. 21, 2000 (JP) .................................... P2000-388799

(51) Int. Cl.[7] .......................................... H01L 29/792
(52) U.S. Cl. ...................... 257/324; 257/314; 257/315; 257/316; 257/411
(58) Field of Search ................................ 257/411, 647, 257/509, 314–316, 324–326; 438/225, 373, 362, 475, 480

(56) References Cited

U.S. PATENT DOCUMENTS

| | | | | |
|---|---|---|---|---|
| 5,168,334 A | * | 12/1992 | Mitchell et al. | 257/324 |
| 5,291,048 A | * | 3/1994 | Nakao | 257/325 |
| 5,470,763 A | * | 11/1995 | Hamada | 257/66 |
| 5,661,335 A | * | 8/1997 | Anjum et al. | 257/506 |
| 5,712,208 A | * | 1/1998 | Tseng et al. | 438/770 |
| 5,768,192 A | | 6/1998 | Eitan | |
| 6,208,002 B1 | * | 3/2001 | Satake et al. | 257/410 |
| 6,372,581 B1 | * | 4/2002 | Bensahel et al. | 257/324 |
| 6,433,382 B1 | * | 8/2002 | Orlowski et al. | 257/315 |
| 6,436,783 B1 | * | 8/2002 | Ono et al. | 438/366 |

FOREIGN PATENT DOCUMENTS

| | | | | |
|---|---|---|---|---|
| JP | 02103965 | * | 10/1988 | ........... H01L/29/78 |
| JP | 401264268 | * | 10/1989 | ........... H01L/29/78 |
| JP | 402103966 | * | 4/1990 | ......... H01L/29/788 |
| JP | 11-040803 | | 2/1999 | |

OTHER PUBLICATIONS

Boaz Eitan, Paolo Pavan, Ilan Bloom, Efraim Aloni, Aviv Frommer, and David Finzi, "Can NROM, a 2 Bit, Trapping Storage NVM Cell, Give a Real Challenge to Floating Gate Cells?", Extended Abstracts of the 1999 International Conference on Solid State Devices and Materials, Tokyo, Japan, 1999, pp. 522–523.

* cited by examiner

Primary Examiner—Long Pham
Assistant Examiner—Thao X. Le
(74) Attorney, Agent, or Firm—McDermott Will & Emery LLP

(57) ABSTRACT

A nonvolatile semiconductor memory device is formed in which data in the form of electrons trapped in the silicon layers directly on the source and the drain respectively can hardly be lost or replaced with other data. The semiconductor device has a memory transistor includes a drain and a source, an insulating layer, and a gate electrode. The drain and the source are formed in an upper region of a semiconductor substrate. The insulating layer, which has an area interrupting the electron migration arranged in a particular region thereof between the drain and the source for interrupting the electron migration, is formed between the drain and the source. In addition, the gate electrode is formed on the insulating layer.

2 Claims, 10 Drawing Sheets

NONVOLATILE SEMICONDUCTOR DEVICE

BACKGROUND OF THE INVENTION

1. Field of the Invention

The present invention relates to a semiconductor device such as a nonvolatile semiconductor memory device.

2. Description of the Prior Art

A conventional nonvolatile semiconductor memory device includes, as shown in FIG. 13, a drain 7 of n+ diffused layer and a source 8 of n+ diffused layer both formed in an upper region of a silicon substrate 1. Also, a gate insulating layer 5 is formed between the drain 7 and the source 8. As a gate electrode 21 is formed on the gate insulating layer 5, the overall arrangement constitutes a memory transistor. Isolating oxide layers (Local Oxidation of Silicon: hereinafter referred to as LOCOS) 6 are formed over the drain 7 and the source 8 respectively. The gate insulating layer 5 in each memory transistor is disconnected over the isolating oxide layers (LOCOS) 6. The gate insulating layer 5 has a multi-layer (Oxide layer/Nitride layer/Oxide layer: hereinafter referred to as ONO) structure consisting mainly of a silicon oxide layer 2, a silicon nitride layer 3, and a silicon oxide layer 4. The nonvolatile semiconductor memory device of this type is generally known as an n-channel MOSFET (hereinafter referred to as NROM) (Boaz Eitan, et al., "Can NROM, a 2 Bit, Trapping Storage NVM Cell, Give a Real Challenge to Floating Gate Cells?", Extended Abstract of the 1999 International Conference on Solid State Devices and Materials, Tokyo, 1999, pp. 522–523 and U.S. Pat. No. 5,768,192).

The writing to the nonvolatile semiconductor device (NROM) will be now explained by referring to the relevant drawings. Memory transistors in the nonvolatile semiconductor device may be operated in two modes where data is recorded in the form of charges trapped in the silicon nitride layer 3 just above the drain 7 (the memory of Bit A) and in the silicon nitride layer 3 just above the source 8 (the memory of Bit B).

The memory of Bit A is explained. Referring to FIG. 14A, while the silicon substrate 1 is grounded and the drain 7, the source 8, and the gate electrode 5 are fed with 5 V, 0 V, and 10 V respectively, channel hot electrons are injected into the silicon nitride layer 3 directly on the drain 7. The injected electrons are trapped in the silicon nitride layer 3 at its trapping level. The trapping of electrons at the trapping level is referred to as the writing of Bit A. For writing of Bit B, while the silicon substrate 1 is grounded and the drain 7, the source 8, and the gate electrode 5 are fed with 0 V, 5 V, and 10 V respectively as shown in FIG. 14B, channel hot electrons are injected into the silicon nitride layer 3 directly on the source 8. The injected electrons are trapped at the trapping level in the silicon nitride layer 3. The trapping of electrons at the trapping level is referred to as the writing of Bit B.

In a conventional nonvolatile memory, data is stored in the form of electrons trapped in the silicon nitride layer 3 directly on the drain 7 or the silicon nitride layer 3 on the source 8. However, when the electrons trapped in the silicon nitride layer 3 directly on the drain 7 migrates in the silicon nitride layer 3 and are moved close to the source 8, the density of electrons trapped in the silicon nitride layer 3 on the drain 7 will be decreased and thus data of Bit A will be lost. Simultaneously, data of Bit B in the source 8 may be replaced. Also, a reverse of this phenomenon will take place. More specifically, data of Bit A may be replaced by data of Bit B or vice versa or lost.

SUMMARY OF THE INVENTION

Therefore, it is an object of the present invention to form a nonvolatile memory semiconductor device where data in the form of electrons trapped in the silicon layer disposed directly on the source or the drain can hardly be lost or replaced by another data.

In accordance with one aspect of the present invention, there is provided a semiconductor device including a drain and a source, an insulating layer, and a gate electrode. The drain and the source are formed in an upper region of a semiconductor substrate. The insulating layer is formed on and between the drain and the source on the semiconductor substrate. The gate electrode is formed on the insulating layer. In addition, the insulating layer has an area arranged between the drain and the source at least on a channel region for interrupting the electron migration. The area may be called as the area interrupting the electron migration.

In other aspect of the present invention, the area interrupting the electron migration extends on the channel region in parallel with the both drain and source.

In further aspect of the present invention, the insulating layer has a multi-layer structure consisting mainly of a silicon oxide layer, a silicon nitride layer, and another silicon oxide layer.

In another aspect of the present invention, the area interrupting the electron migration includes a hydrogen injected region.

In a further aspect of the present invention, the area interrupting the electron migration includes a fluorine injected region.

In a still further aspect of the present invention, the area interrupting the electron migration comprises the silicon nitride layer extending discontinuously and the silicon oxide layer filling the discontinuous portions in the silicon nitride layer.

In accordance with one aspect of the present invention, there is provided a method of manufacturing a semiconductor device including the following steps:

S1: forming a drain and a source in an upper region of a semiconductor substrate;

S2: forming an insulating layer on and between the drain and the source on the semiconductor substrate;

S3: forming an area interrupting the electron migration in the insulating layer at least on a channel region between the drain and the source for interrupting the electron migration; and S4: forming a gate electrode on the insulating layer.

In other aspect of the present invention, there is provided a method of manufacturing a semiconductor including the following steps:

S5: forming an insulating layer on a semiconductor substrate;

S6: forming a mask layer (e.g. silicon nitride layer) on the insulating layer

S7: patterning the mask layer;

S8: etching the insulating layer to form at least two apertures by using a pattern of the mask layer;

S9: implanting ions into the semiconductor substrate through the two apertures in the insulating layer to form injected regions in an upper region of the semiconductor substrate;

S10: heating and oxidizing the upper region of the semiconductor substrate through the two apertures to form isolating oxide layers;

S11: forming oxide layers on the isolating oxide layers to fill up the two apertures;

S12: removing the mask layer (e.g. silicon nitride layer) to leave desired portions of the oxide layers on the isolating oxide layers;

S13: forming side walls around each portion of the oxide layers on the isolating oxide layers;

S14: implanting ions into an exposed region of the insulating layer between the two side walls to form an ion injected region; and S15: forming a word line on the exposed region of the insulating layer.

In further aspect of the present invention, the step of implanting an ion injected region employs hydrogen ions to be implanted.

In another aspect of the present invention, the step of implanting an ion injected region employs fluorine ions to be implanted.

In an aspect of the present invention, there is provided a method of manufacturing a semiconductor device including the following steps:

S5: forming an insulating layer on a semiconductor substrate;

S6: forming a mask layer (e.g. silicon nitride layer) on the insulating layer;

S7: patterning the mask layer;

S8: etching the insulating layer to form at least two apertures by using a pattern of the mask layer;

S9: implanting ions into the semiconductor substrate through the two apertures in the insulating layer to form injected regions in an upper region of the semiconductor substrate;

S10: heating and oxidizing the upper region of the semiconductor substrate through the two apertures to form isolating oxide layers;

S11: forming oxide layers on the isolating oxide layers to fill up at least two apertures;

S12: removing the mask layer (e.g. silicon nitride layer) to leave desired portions of the oxide layers on the isolating oxide layers;

S13: forming side walls around each portion of the oxide layers on the isolating oxide layers;

S16: etching an exposed region of the insulating layer between the two side walls;

S17: filling the etched region of the insulating layer with an oxide layer; and

S18: forming a word line on the oxide layer applied.

In other aspect of the present invention, the insulating layer has a multi-layer structure consisting mainly of a silicon oxide layer, a silicon nitride layer, and another silicon oxide layer.

According to the semiconductor device of the present invention, there is a semiconductor device having an area interrupting the electron migration arranged in a channel region of the insulating layer above an intermediate between the drain and the source. As electrons trapped in the silicon nitride layers directly on the drain and the source are inhibited from migrating, bit data stored in the drain and the source can remain securely held without being lost.

According to the semiconductor device of the present invention, the area interrupting the electron migration extends on the channel region in the insulating layer which extends in parallel with both the drain and the source. This area inhibits electrons trapped in the silicon nitride layers directly on the drain and the source from migrating. Accordingly, bit data stored can remain held without being lost.

According to the semiconductor device of to the present invention, the insulating layer has a multi-layer structure consisting mainly of a silicon oxide layer, a silicon nitride layer, and another silicon oxide layer. Accordingly, the insulating layer can have stable properties.

According to the semiconductor device of the present invention, the area interrupting the electron migration is a hydrogen ion injected region. This area inhibits electrons trapped in the silicon nitride layers directly on the drain and the source from migrating. Accordingly, bit data stored can remain held without being lost.

According to the semiconductor device of the present invention, the area interrupting the electron migration is a fluorine ion injected region. This area inhibits electrons trapped in the silicon nitride layers directly on the drain and the source from migrating. Accordingly, bit data stored can remain held without being lost.

According to the semiconductor device of the present invention, the area interrupting the electron migration includes the silicon nitride layer extending discontinuously and the silicon oxide layer filling the discontinuous portions in the silicon nitride layer. This silicon oxide layer inhibits electrons trapped in the silicon nitride layers directly on the drain and the source from migrating. Accordingly, bit data stored can remain held without being lost.

According to the method of manufacturing a semiconductor device of the present invention, it may be provided by forming an area interrupting the electron migration in a channel region of the insulating layer above an intermediate between the drain and the source for interrupting the electron migration. Accordingly, bit data stored can remain held without being lost.

According to the another method of manufacturing a semiconductor device of the present invention, it may be provided by forming an area interrupting the electron migration by ion implantation in the insulating layer between the drain and the source at least on the channel region for interrupting the electron migration. Accordingly, bit data stored can remain held without being lost. In this method, as the side walls are formed, an exposed region of the insulating layer between the two side walls can accurately be injected with ions for forming the area interrupting the electron migration. This permits the channel of the transistor to be decreased in the length thus contributing to the down sizing of the memory cell.

According to the method of manufacturing a semiconductor device of the present invention, the area interrupting the electron migration is formed by doping hydrogen ions. This area inhibits electrons trapped in the silicon nitride layers directly on the drain and the source from migrating. Accordingly, bit data stored can remain held without being lost.

According to the method of manufacturing a semiconductor device of the present invention, the area interrupting the electron migration is formed by doping fluorine ions. This area inhibits electrons trapped in the silicon nitride layers directly on the drain and the source from migrating. Accordingly, bit data stored can remain held without being lost.

According to the further method of manufacturing a semiconductor device of the present invention, a discontinuous region of the silicon nitride layer in the insulating layer is arranged by filling with the silicon oxide layer for forming the area interrupting the electron migration. This area inhibits electrons trapped in the silicon nitride layers directly on the drain and the source from migrating. Accordingly, bit data stored can remain held without being lost.

According to the method of manufacturing a semiconductor device of the present invention, the insulating layer has a multi-layer structure consisting mainly of a silicon oxide layer, a silicon nitride layer, and another silicon oxide layer. Accordingly, the insulating layer can have stable properties.

DETAILED DESCRIPTION OF THE INVENTION

Figure 1:
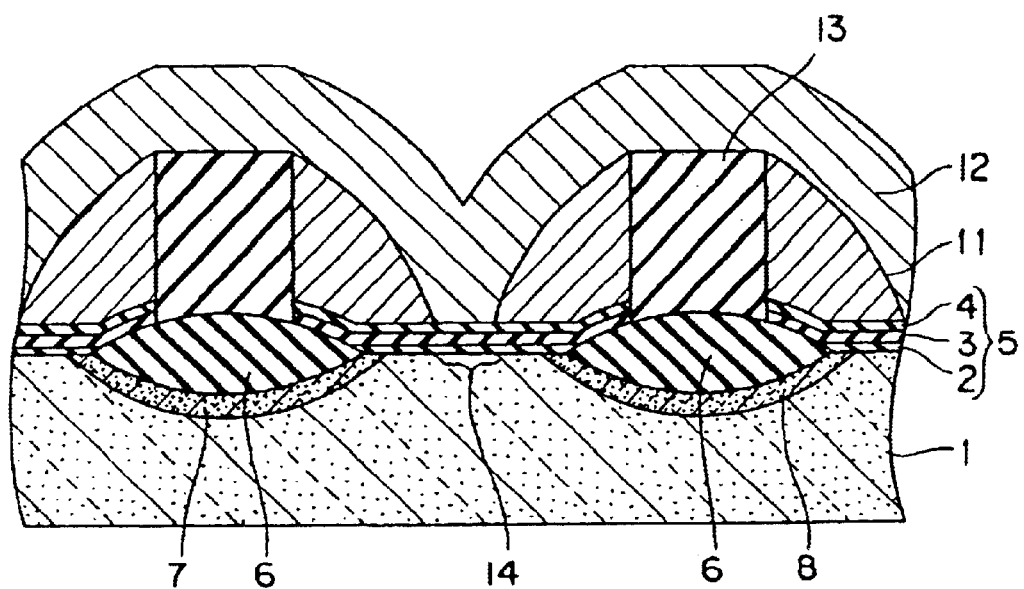
FIG. 1 is a cross sectional view of a semiconductor device showing the first embodiment of the present invention.

A semiconductor device according to the present invention has an area interrupting the electron migration arranged in a channel region of a silicon nitride layer, which is a member of a gate insulating layer, above an intermediate between the drain and the source for interrupting the electron migration. The area interrupting the electron migration may be a hydrogen ion injected region by implanting or a fluorine ion injected region by implanting. The ion injected region is not limited to those but may be an oxygen ion injected region by implanting. Alternatively, the area interrupting the electron migration may be a discontinuous region of the silicon nitride layer in the insulating layer which is filled with a silicon oxide layer. In the semiconductor device of the present invention, as the silicon nitride layer in the gate insulating layer has the area interrupting the electron migration, electrons trapped in the silicon nitride layer directly above the drain or the source can hardly migrate from one to another location. Accordingly, bit data stored will remain securely held without being lost.

A conventional semiconductor device is disclosed in Japanese Laid-Open Patent Publication No. 11-40803 where the gate insulating layer including a silicon oxide layer or a silicon nitride layer contains $10^{20}$ to $10^{21}$ per cubic centimeter of halogen atoms. The halogen atoms are implanted throughout the gate insulating layer for improving the resistance to insulation fracture of the gate insulating layer. When the halogen atoms are implanted throughout the gate insulating layer, electrons introduced for storage of data may be trapped with much difficulty. Accordingly, the storing data will be distressed or time-consumable. The conventional semiconductor device is not an NROM for storage of data in the gate insulating layers directly on the drain and the source. The present invention is intended to eliminate the disadvantage of a typical NROM that the electron migration from the drain or the source results in the loss of data. The semiconductor device of the present invention has an area interrupting the electron migration arranged in a particular region of the gate insulating layer not directly on but between the drain and the source where data are stored, thus inhibiting the electron migration between the drain and the source.

A semiconductor device according to the first embodiment of the present invention has a hydrogen ion injected region arranged including a channel in the silicon nitride layer, which is a member of a gate insulating layer, as located above the intermediate between the drain and the source. The hydrogen ion injected region acts as an area interrupting the electron migration for interrupting the electron migration, hence causing electrons trapped in two areas of the silicon nitride layer above the drain and the source respectively to hardly migrate. As a result, bit data stored in the drain and the source can stay without being lost.

More particularly, the semiconductor device of this embodiment has, as shown in the cross sectional view of FIG. 1, a hydrogen ion injected region 14 arranged as an area interrupting the electron migration including a channel in a silicon nitride layer 3, which is a member of a gate insulating layer 5, as located above the intermediate between a drain 7 and a source 8, which contains substantially $2\times10^{21}$ per cubic centimeter of hydrogen ions 17. The channel of the silicon nitride layer may be injected with not only hydrogen ions but also fluorine ions, oxygen ions, or any appropriate ions. The ion concentration may preferably range from $10^{18}$ to $10^{23}$ per cubic centimeter. As a whole, the semiconductor device has an NROM structure including an n+ diffused layer of the drain 7 and an n+ diffused layer of the source 8 formed in an upper area of a silicon substrate 1 is preferably of p type. The gate insulating layer 5 is formed over and between the drain 7 and the source 8. As a gate electrode is formed on the gate insulating layer 5, the arrangement incorporates a memory transistor. Isolating oxide layers (LOCOS) 6 are formed over the drain 7 and the source 8 respectively. A silicon oxide layer 13 is formed on each isolating oxide layer 6 for disconnecting the gate insulating layer 5 in the memory transistor.

The gate insulating layer 5 has a multi-layer (ONO) structure including a silicon oxide layer 2, a silicon nitride layer 3, and another silicon oxide layer 4. The silicon nitride layer 3 includes the hydrogen ion injected region 14 located in the center of the channel between the drain 7 and the source 8. The gate electrode includes a word line 12 and side walls 11.

The isolating oxide layers 6 are formed by a LOCOS technique with thermal oxidation, but not limited to, and may be replaced by a trench isolation. Any other isolating oxide layer may be employed.

Figure 2:
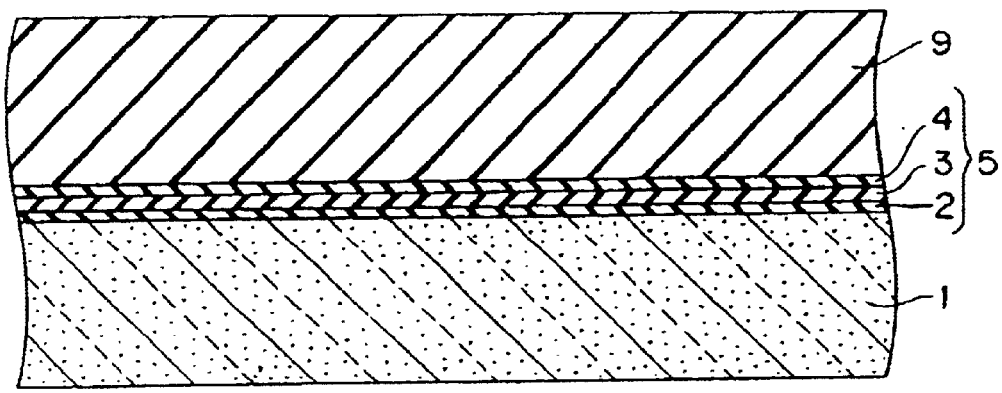
FIG. 2 is a cross sectional view of a gate insulating layer and a silicon nitride layer formed in this order on a silicon substrate according to a method of manufacturing the semiconductor device of the first embodiment of the present invention.

The method of manufacturing the semiconductor device of this embodiment will be described. The method starts with forming a silicon oxide layer 2 of 6 nm thick on a silicon substrate 1 by a thermal oxidation technique, such as oxidation with steam at 850° C. Using a Low Pressure CVD technique with $SiH_2Cl_2$ gas and $NH_3$ gas, a silicon nitride layer 3 of 10 nm thick is formed on the silicon oxide layer 2. Also, using the Low Pressure CVD technique with $SiH_2Cl_2$ gas and $N_2O$ gas, a silicon oxide layer 4 of 6 nm thick is formed on the silicon nitride layer 3. A combination of the silicon oxide layer 2, the silicon nitride layer 3, and the silicon oxide layer 4 constitutes an insulating layer 5. Then, using the Low Pressure CVD technique with $SiH_2Cl_2$ gas and $NH_3$ gas, a silicon nitride layer 9 of 300 nm thick is formed on the silicon oxide layer 4 (FIG. 2).

Figure 3:
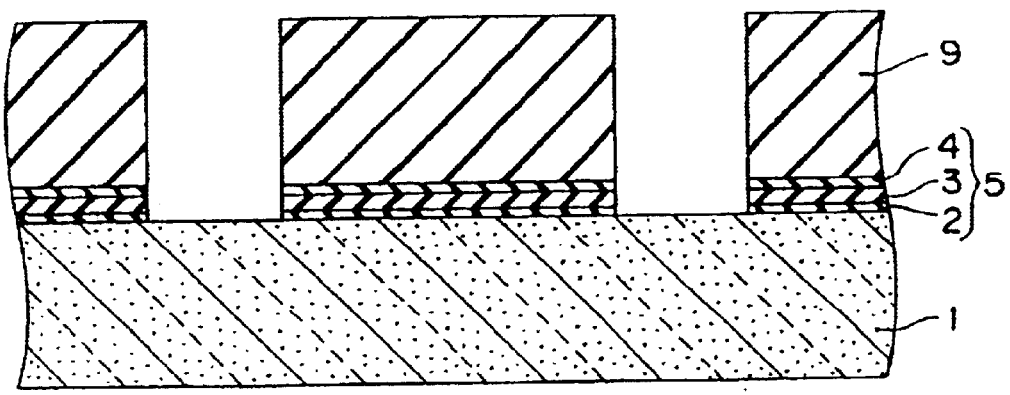
FIG. 3 is a cross sectional view of the silicon substrate exposed partially with etching according to the method of manufacturing the semiconductor device of the first embodiment of the present invention.
Figure 4:
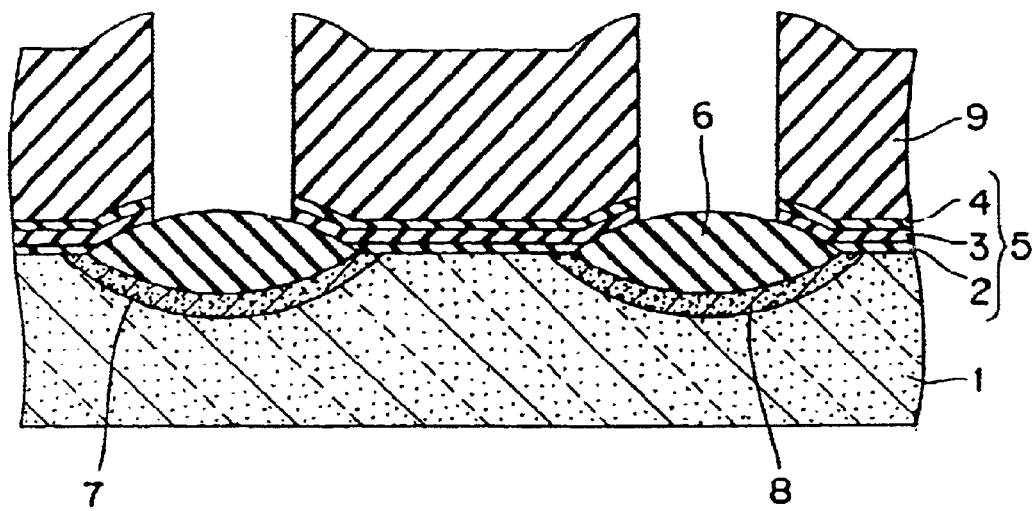
FIG. 4 is a cross sectional view of isolating oxide layers formed by thermal oxidation after a injected region formed by ion implantation according to the method of manufacturing the semiconductor device of the first embodiment of the present invention.
Figure 5:
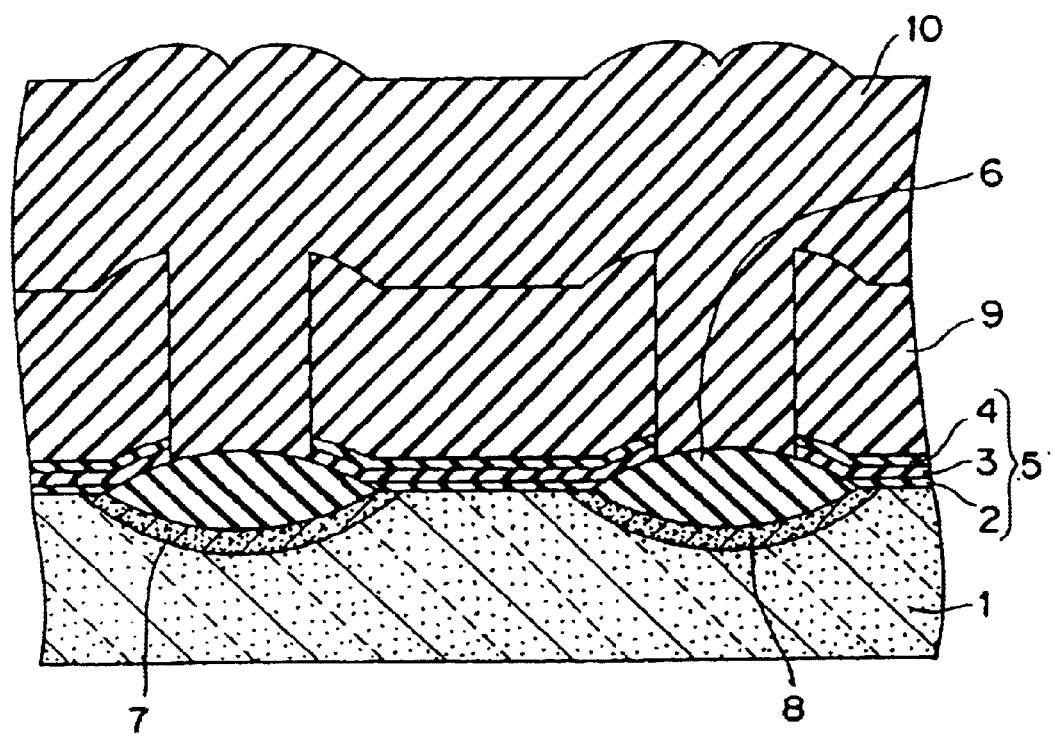
FIG. 5 is a cross sectional view of a thick silicon oxide layer formed by Low pressure CVD method according to the method of manufacturing the semiconductor device of the first embodiment of the present invention.
Figure 6:
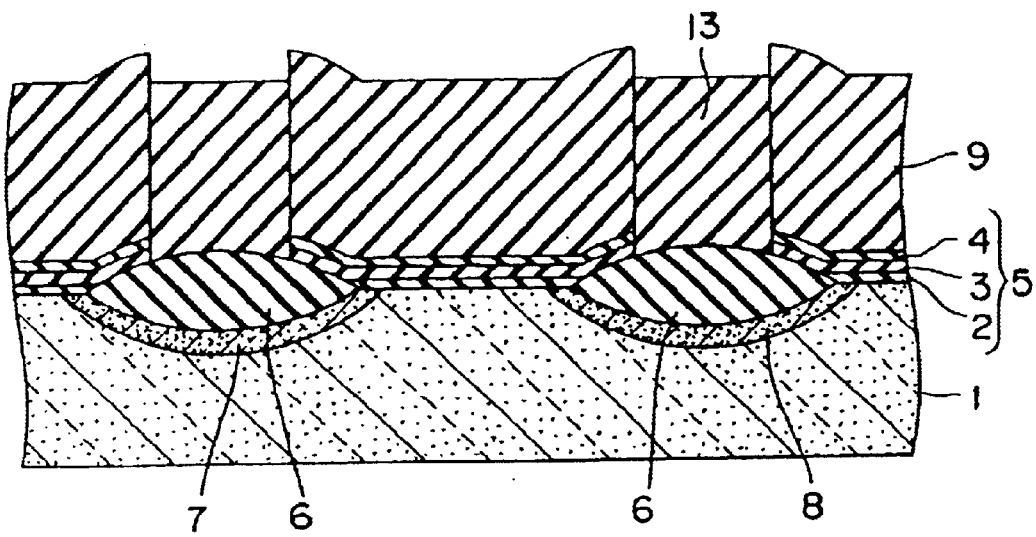
FIG. 6 is a cross sectional view of the silicon nitride layer planarized by chemical mechanical polishing and etched back to leave its portion according to the method of manufacturing the semiconductor device of the first embodiment of the present invention.
Figure 7:
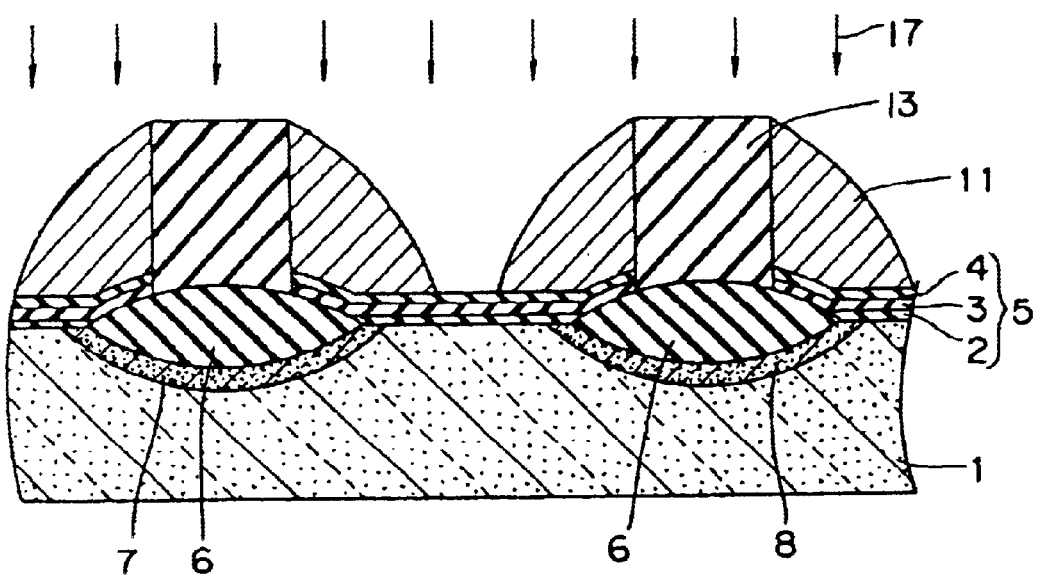
FIG. 7 is a cross sectional view of side walls formed by dry etching after removal of the silicon nitride layer and deposition of phosphorus injected poly-silicon according to the method of manufacturing the semiconductor device of the first embodiment of the present invention.

This is followed by photo-lithographically patterning the silicon nitride layer 9 and etching the silicon oxide layer 2, the silicon nitride layer 3, and the silicon oxide layer 4 of the insulating layer 5 to form a stripe pattern of apertures by making use of the patterned silicon nitride layer 9 as a mask layer (FIG. 3). Arsenic ions at $2 \times 10^{15}$ $cm^{-2}$ are injected through the apertures into the silicon substrate 1 by ion implantation to form injected regions. Then, the silicon substrate is heated up through the apertures to form isolating oxide layers (LOCOS) 6. During the thermal oxidation, the arsenic ions in the injected regions are activated to form a drain 7 and a source 8 of n+ diffused layer under the isolating oxide layers 6 in an upper region of the silicon substrate (FIG. 4). Using the Low Pressure CVD, a silicon oxide layer 10 of 400 nm thick is formed to fill up the apertures (FIG. 5). The silicon oxide layer 10 is then planarized by a chemical mechanical polishing (hereinafter referred to as CMP) technique and etched back by dry etching so that its desired portions 13 are left static (FIG. 6). Then, the silicon nitride layer 9 is removed using heated phosphoric acid. A phosphorus injected poly-silicon layer is formed to a thickness of 400 nm by the Low Pressure CVD and then dry etched to form side walls 11 about the silicon oxide layer 13 on the isolating oxide layers 6 (FIG. 7). While the silicon oxide layers 13 and the side walls 11 are being masked, the silicon nitride layer 3 is injected at its exposed region between the drain 7 and the source 8 with hydrogen ions at $2 \times 10^{15}$ $cm^{-2}$ using the ion implantation technique. As a result, $2 \times 10^{21}$ per cubic centimeter of the hydrogen ions 17 are implanted in the exposed region of the silicon nitride layer 3 which thus forms a hydrogen ion injected region 14. The ion concentration in the silicon nitride layer may preferably range from $10^{18}$ to $10^{23}$ per cubic centimeter.

Figure 8:
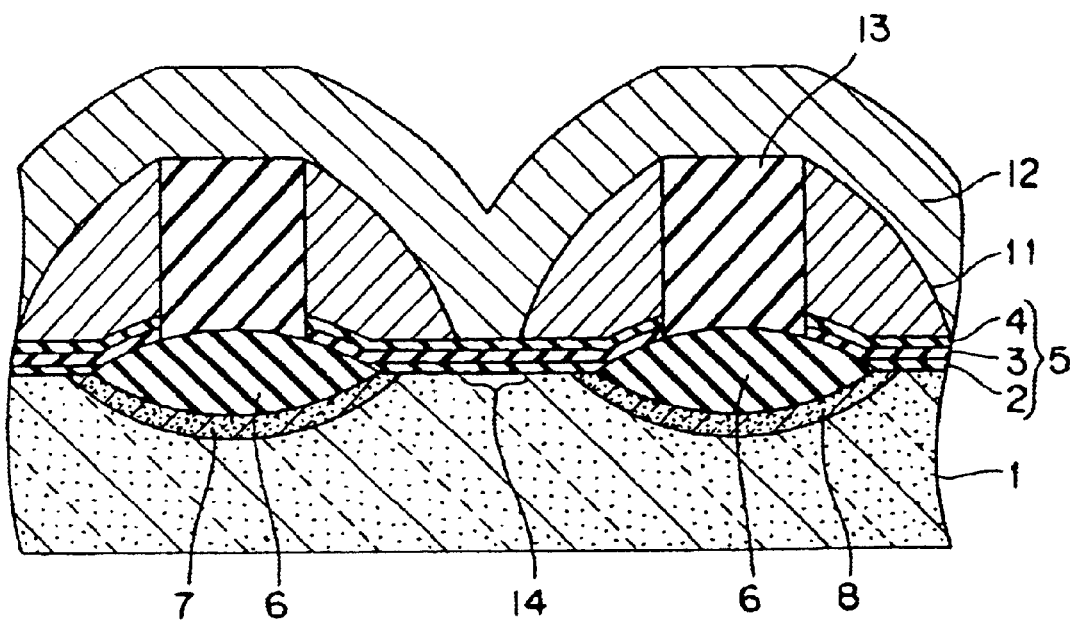
FIG. 8 is a cross sectional view of word lines and gate electrodes formed according to the method of manufacturing the semiconductor device of the second embodiment of the present invention.

This is followed by forming a 200-nm thick phosphorus injected poly-silicon layer using the Low Pressure CVD. When the phosphorus injected poly-silicon layer is photo-lithographically patterned and etched, a word line 12 is formed. Then, by heat treatment at 850° C., phosphorus ions in the phosphorus injected poly-silicon layer of the word line 12 and the side walls 11 are activated. As a result, the word line 12 and the side walls 11 constitute a gate electrode (FIG. 8).

In those steps, the semiconductor device of a memory transistor is fabricated which includes the drain 7 and the source 8 formed in the upper region of the semiconductor substrate 1, the insulating layer 5 formed on and between the drain 7 and the source 8, and the gate electrode formed on the insulating layer 5. The semiconductor device has the hydrogen ion injected region 14 arranged in the insulating layer between the drain 7 and the source 8 for interrupting the electron migration.

According to the method of manufacturing the semiconductor device, the region of the gate insulating layer 5 where the hydrogen ions 17 are injected is determined as an exposed area at substantially the center between the two side walls 11, each located about the silicon oxide layer on the isolating oxide layers 6. In case that the hydrogen ion injected region 14 is formed by patterning after the removal of the silicon nitride layer 9 without the forming the side walls 11, its position may be slid from the channel center. This results from a masking positional error in the patterning process. If the hydrogen ion injected region 14 in the silicon nitride layer 3 is formed just above the drain 7 or the source 8, the trapping of hot electrons will extremely be difficult thus declining the speed of writing. The method of manufacturing the semiconductor device thus allows the silicon oxide layer 13 to be formed on the oxidation isolating layer 6 before the silicon nitride layer 9 is removed out. As the two side walls 11 are formed about the corresponding silicon oxide layers 13 after the removal of the silicon nitride layer 9, the center in the channel between the two side walls 11 can accurately be identified and exposed for forming the hydrogen ion injected region 14. For this reason, the forming of the side walls 11 is most preferable.

The semiconductor device of this embodiment allows the silicon nitride layers 3 just above the drain 7 and the source 8 to hold data stably due to the following advantageous effect. In general, charges trapped in the silicon nitride layer 3 above the drain are considered to be held at its trapping level. When the charges trapped are thermally activated, they may be hopped in mechanism from the trapping level to another vacant level in the horizontally continuous silicon nitride layer 3 where no electrons are trapped. It is supposed in the semiconductor device that the hydrogen ions implanted in the region of the silicon nitride layer 3 are coupled to a dangling bond by heat treatment thus declining the trapping level in the silicon nitride layer 3. The implanted ions may inhibit the electrons trapped in the silicon nitride layer 3 above the drain 7 from migrating to the source 8. Similarly, electrons trapped in the silicon nitride layer 3 just above the source 8 can be inhibited from migrating to the drain 7. Accordingly, bit data stored in the drain and the source will remain securely held without being lost.

The writing data into the nonvolatile memory is now explained. The nonvolatile semiconductor memory device as a memory transistor is operated in two modes where data is stored in the form of charges trapped in the silicon nitride layer 3 above the drain 7 (the memory of Bit A) and in the silicon nitride layer 3 above the source 8 (the memory of Bit B). The writing of Bit A is first explained. It is assumed that the silicon substrate 1 is grounded. For writing of Bit A, the drain 7, while the source 8, and the gate electrode are fed with 5 V, 0 V, and 10 V respectively, channel hot electrons are injected into the silicon nitride layer 3 above the drain 7. More specifically, the electrons are trapped at the trapping level in the silicon nitride layer 3. This action is defined as the writing of Bit A.

The writing of Bit B is then explained. For writing of Bit B, while the drain 7, the source 8, and the gate electrode are fed with 0 V, 5 V, and 10 V respectively with the silicon substrate 1 being grounded, channel hot electrons are injected into the silicon nitride layer 3 above the source 8. More specifically, the electrons are trapped at the trapping level in the silicon nitride layer 3. This action is referred as the writing of Bit B.

The reading data from the nonvolatile semiconductor memory device is explained. For reading Bit A, while the drain 7, the source 8, and the gate electrode are fed with 0 V, 2 V, and 4 V respectively, the silicon substrate 1 is grounded. As a result, a depletion layer is generated adjacent to the source 8. This can minimize the effect of electrons trapped in the silicon nitride layer 3 above the source 8 over the threshold of the transistor. In other words, the electrons trapped in the silicon nitride layer 3 above the drain 7 can act on the threshold of the transistor. While the electrons are trapped in the silicon nitride layer 3 above the drain 7, the threshold of Bit A remains high. It is then defined that the high state of the threshold represents "1" of a binary level. When no electrons are trapped in the silicon nitride layer 3 above the drain 7, the threshold of Bit A remains low. The low state of the threshold is then referred to as "0" of binary level.

For reading Bit B, the drain 7, the source 8, and the gate electrode are fed with 2 V, 0 V, and 4 V respectively and the silicon substrate 1 is grounded. The two logic states "1" and "0" of Bit B are determined by the same manner for Bit A.

The erasing data is now explained. For erasing data of Bit A, while the silicon substrate 1 is grounded, the drain 7, the source 8, and the gate electrode are fed with 6 V, 0 V, and −4 V respectively. Also, interband tunneling inductive hot holes are injected into the drain area. As the holes are injected to the silicon nitride layer 3, they are coupled with charges trapped therein hence eliminating the negative charges. This action involves erasing of Bit A.

For erasing data of Bit B, while the silicon substrate 1 is grounded, the drain 7, the source 8, and the gate electrode are fed with 0 V, 6 V, and −4 V respectively. Accordingly, data of Bit B is erased by the same theory as of Bit A.

The nonvolatile semiconductor memory device has the hydrogen ion injected region 14 arranged in the silicon nitride layer 3 of the gate insulating layer 5 for interrupting the electron migration. This region will inhibit the charges from migrating across the hydrogen ion injected region 14, hence permitting data of both Bit A and Bit B to remain securely held without being lost.

A nonvolatile semiconductor memory device according to the second embodiment of the present invention has a fluorine ion injected region arranged in an intermediate between the drain and the source of a silicon nitride layer which is a member of a gate insulating layer. As the fluorine ion injected region acts as an electron migration interrupting zone for interrupting the electron migration, the electrons trapped in the silicon nitride layers above the drain and the source respectively can hardly migrate from one to another location. Accordingly, bit data stored in the drain and the source will remain securely held without being lost.

More particularly, the semiconductor device of this embodiment differs from the nonvolatile semiconductor memory device of the first embodiment in that the area interrupting the electron migration is the fluorine ion injected region 14. As a whole, the semiconductor device includes a drain 7 of $n^+$ diffused layer and a source 8 of $n^+$ diffused layer both formed in an upper region of a silicon substrate 1. A gate insulating layer 5 is formed over and between the drain 7 and the source 8. As a gate electrode including a word line 12 and side walls 11 is formed on the gate insulating layer 5, the arrangement incorporates a memory transistor. Also, isolating oxide layers (LOCOS) 6 are formed on the drain 7 and the source 8 respectively. A silicon oxide layer 13 is formed on each isolating oxide layer 6 to disconnect the gate insulating layer 5 in the memory transistor.

A method of manufacturing the semiconductor device of this embodiment will now be described. This method of manufacturing the semiconductor device differs from the method of manufacturing the semiconductor memory device of the first embodiment in that the silicon nitride layer 3 in the gate insulating layer 5 has a fluorine ion injected region 15 arranged therein as the electron migration interruption area which is injected with fluorine ions not hydrogen ions.

In practice, side walls 11 are formed by the same manner as of the first embodiment. Then, while the silicon oxide layers 13 and the side walls 11 are being masked, the silicon nitride layer 3 is injected with fluorine ions at $2 \times 10^{15}$ cm$^{-2}$ using the ion implantation technique. As a result, $2 \times 10^{21}$ per cubic centimeter of the fluorine ions are implanted in an exposed region of the silicon nitride layer 3 which thus turns to the fluorine ion injected region 15 as the electron migration interruption area. Similar to the method of the first embodiment, a 200-nm thick phosphorus injected poly-silicon layer is formed using the Low Pressure CVD. When the phosphorus injected poly-silicon layer is photolithographically patterned and etched, a word line 12 is formed. Then, by heat treatment at 850° C., phosphorus ions in the phosphorus injected poly-silicon layer of the word line 12 and the side walls 11 are activated. As a result, the word line 12 and the side walls 11 constitute a gate electrode.

In those steps, the semiconductor device with a memory transistor is manufactured which includes the drain 7 and the source 8 formed in the upper region of the semiconductor substrate 1, the insulating layer 5 formed on and between the drain 7 and the source 8, and the gate electrode consisting of the word line 12 and the side walls 11 formed on the insulating layer 5. The semiconductor device of this embodiment has the fluorine ion injected region 15 arranged in the portion of the silicon nitride layer 3, which acts as an insulating layer between the drain 7 and the source 8, for interrupting the electron migration.

It is supposed in the semiconductor device that the fluorine ions implanted in the region of the silicon nitride layer 3 are coupled to a dangling bond by heat treatment thus declining the trapping level in the silicon nitride layer 3. The implanted ions may inhibit the electrons trapped in the silicon nitride layer 3 above the drain 7 from migrating to the source 8. Similarly, electrons trapped in the silicon nitride layer 3 just above the source 8 can be inhibited from migrating to the drain 7. Accordingly, bit data stored in the drain and the source will remain securely held without being lost.

A semiconductor device according to the third embodiment of the present invention has a discontinuous region arranged by the insertion of a silicon oxide layer at an intermediate of the silicon nitride layer, which forms a gate insulating layer, between the drain and the source. As the discontinuous region of the silicon nitride layer acts as an electron migration interruption area for interrupting the electron migration, electrons trapped in the silicon nitride layers located just above the drain and the source respectively can be inhibited from migrating. Accordingly, bit data stored in the drain and the source will remain securely held without being lost.

Figure 9:
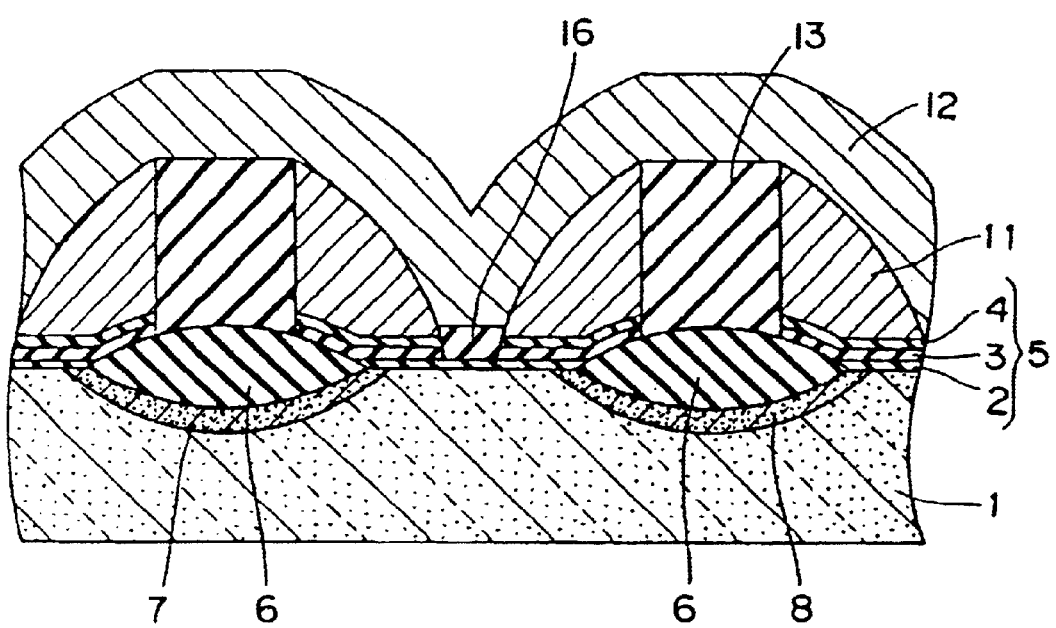
FIG. 9 is a cross sectional view of a nonvolatile semiconductor memory device according to the third embodiment of the present invention.

More specifically, the semiconductor device of this embodiment differs from the nonvolatile semiconductor memory device of the first embodiment in that the electron migration interruption area is the discontinuous region of the silicon nitride layer 3 implemented by the insertion of a silicon oxide layer 16, as shown in FIG. 9. As a whole, the semiconductor device of this embodiment includes a drain 7 of n+ diffused layer and a source 8 of n+ diffused layer both formed in an upper region of a silicon substrate 1. A gate insulating layer 5 is formed over and between the drain 7 and the source 8. As a gate electrode including a word line 12 and side walls 11 are formed on the gate insulating layer 5, the arrangement incorporates a memory transistor. Also, isolating oxide layers (LOCOS) 6 are formed directly on the drain 7 and the source 8 respectively. A silicon oxide layer 13 is formed on each isolating oxide layer 6 to disconnect the gate insulating layer 5 in the memory transistor.

A method of manufacturing the semiconductor device of this embodiment will now be described referring to the relevant drawings. This method of manufacturing the semiconductor device differs from the method of manufacturing the semiconductor memory device of the first embodiment in that the electron migration interruption area is a discontinuous region of the silicon nitride layer 3 which is formed by etching a portion of the silicon nitride layer 3 to have a recess which is then filled with a silicon oxide layer 16.

Figure 10:
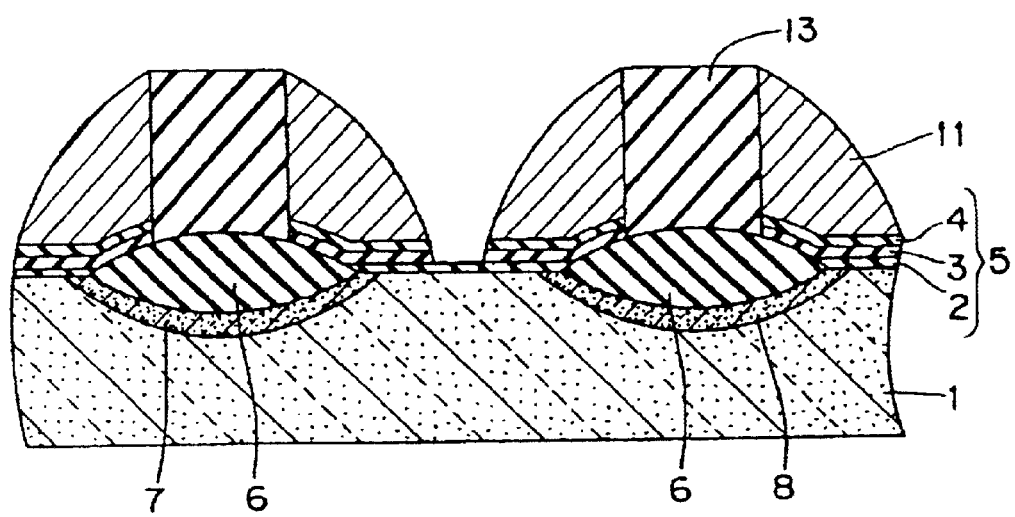
FIG. 10 is a cross sectional view showing a step of a method of manufacturing the nonvolatile semiconductor memory device of the third embodiment of the present invention.
Figure 11:
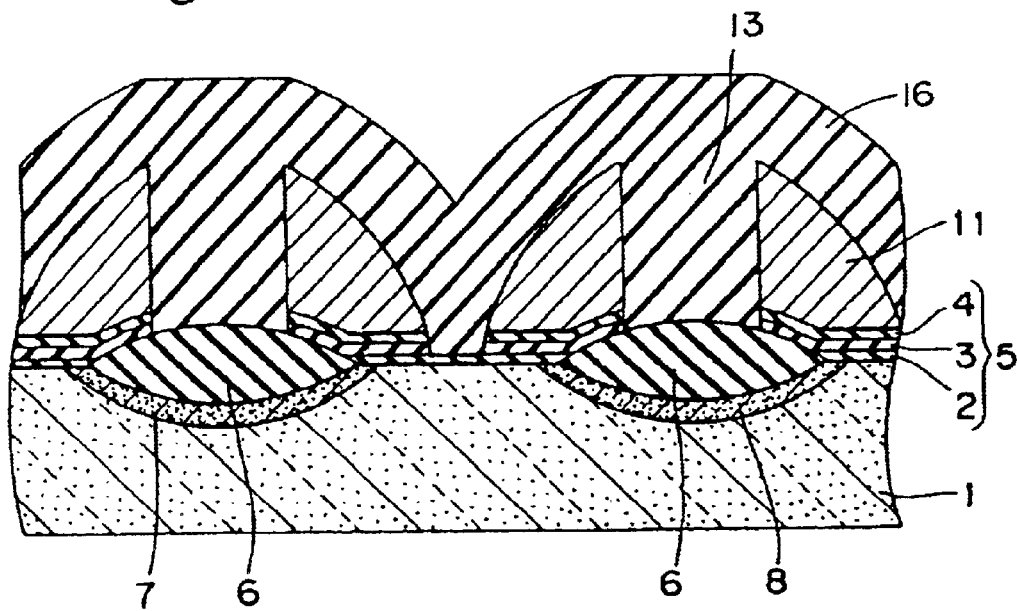
FIG. 11 is a cross sectional view showing a step of the method of manufacturing the nonvolatile semiconductor memory device of the third embodiment of the present invention.
Figure 12:
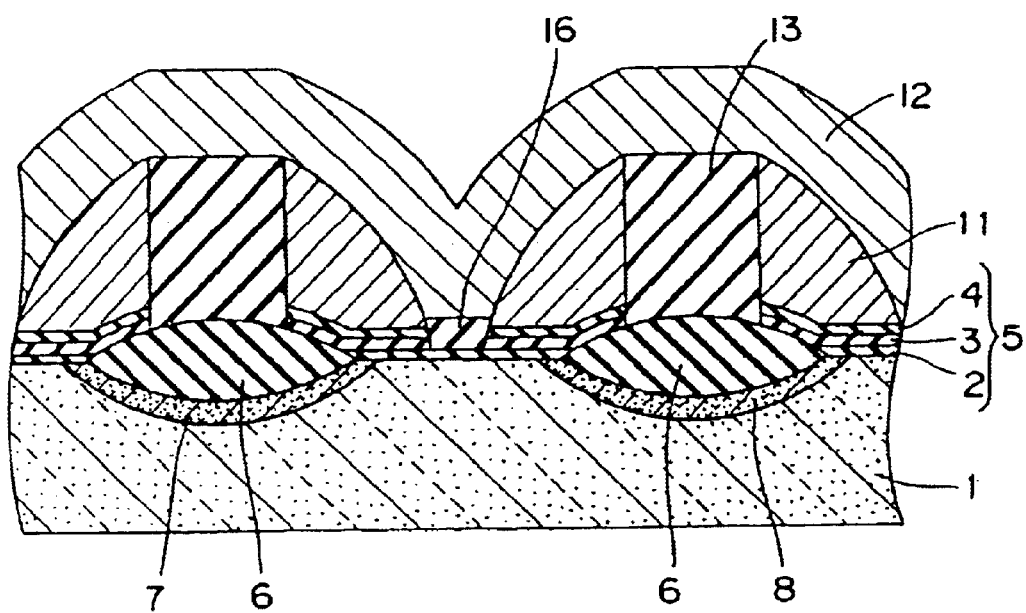
FIG. 12 is a cross sectional view of a discontinuous region of the silicon nitride layer filled with a silicon oxide layer for forming the area interrupting the electron migration according to the method of manufacturing the nonvolatile semiconductor memory device of the third embodiment of the present invention.
Figure 13:
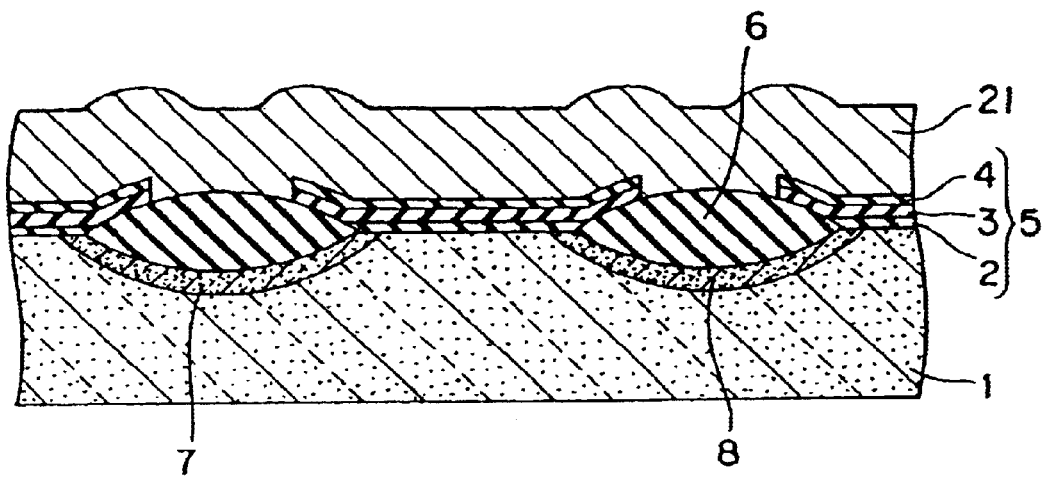
FIG. 13 is a cross sectional view of a conventional semiconductor device.
Figure 14A:
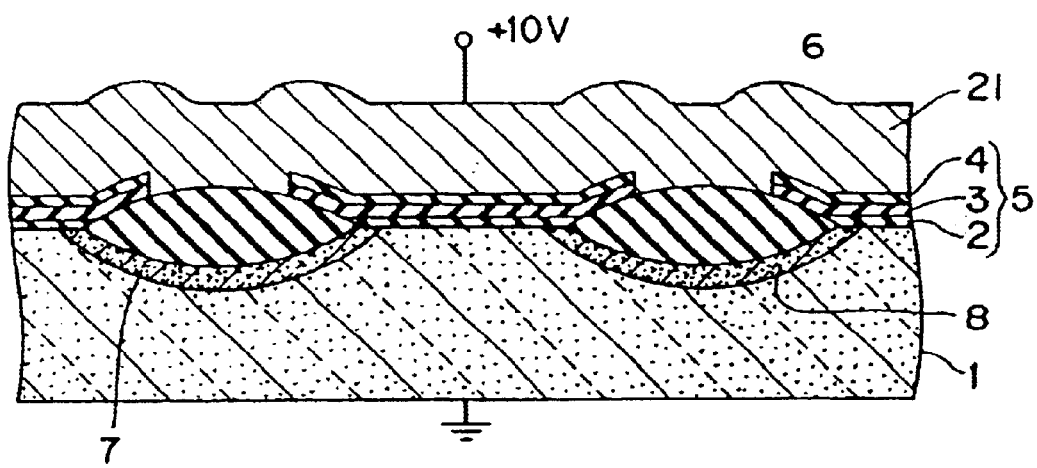
FIG. 14A is a view explaining the writing Bit A in the semiconductor device shown in FIG. 13
Figure 14B:
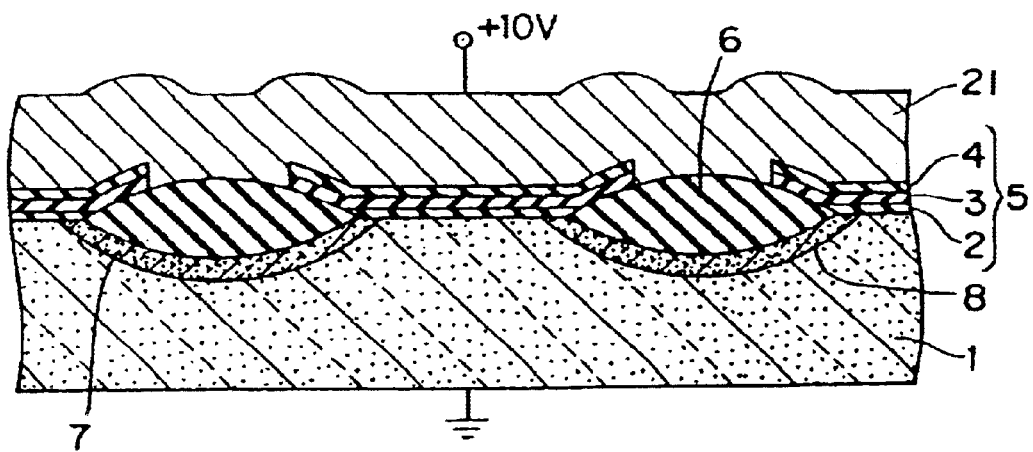
FIG. 14B is a view explaining the writing Bit B in the semiconductor device shown in FIG. 13.

In practice, side walls 11 are formed by the same manner as of the first embodiment (FIG. 7). Then, while being masked with the silicon oxide layers 13 and the side walls 11, the silicon oxide layer 4 is partially removed by dry etching. In addition, the silicon nitride layer 3 is partially removed by dry etching (FIG. 10). Then, the silicon oxide layer 16 is formed to a thickness of 300 nm using the Low Pressure CVD (FIG. 11). Most of the silicon oxide layer 16 is then etched back and removed to leave its portion at the (discontinuous) region where a portion of the silicon nitride layer 3 is removed. As a result, the electron migration interruption area is implemented by the discontinuous region of the silicon nitride layer 3 formed by the insertion of the silicon oxide layer 16 (FIG. 12). This is followed by the same steps as those of the method of manufacturing the semiconductor device of the first embodiment to complete the semiconductor device of this embodiment.

This semiconductor device has the silicon nitride layer 3 to be disconnected at the channel center of the transistor structure. As a result, the migration to the source of electrons trapped in the silicon nitride layer 3 above the drain 7 can be inhibited. Similarly, the migration to the drain 7 of electrons trapped in the silicon nitride layer 3 above the source 8 can be inhibited. Accordingly, bit data stored in the drain 7 and the source 8 will remain securely held without being lost.

What is claimed is:

1. A semiconductor device comprising:

a drain and a source formed in an upper region of a semiconductor substrate;

an insulating layer formed on the semiconductor substrate between the drain and the source; and a gate electrode formed on the insulating layer, wherein the insulating layer has a multi-layer structure consisting mainly of a lower silicon oxide layer, and intermediate silicon nitride layer and an upper silicon oxide layer, and wherein the insulating layer has an area comprising a discontinuous portion in the intermediate silicon nitride layer filled in by the upper silicon oxide layer which is arranged between the drain and the source at least on a channel region for interrupting the electrode migration between the insulating layer on the drain and the insulating layer on the source.

2. A semiconductor device comprising:

a drain and a source formed in an upper region of a semiconductor substrate;

an insulating layer formed on the semiconductor substrate between the drain and the source, the insulating layer having a multi-layer structure of a silicon oxide layer, a silicon nitride layer, and another silicon oxide layer, wherein data is stored in the form of electrons trapped in the silicon nitride layer either above the drain or above the source; and a gate electrode formed on the insulating layer, wherein the silicon nitride layer within the insulating layer has an area, comprising a hydrogen injected region or a fluorine injected region, arranged above a part of a channel region, the area spaced from both of the drain and the source, whereby the trapped electrons can not move through the area in the silicon nitride layer; and wherein the hydrogen injected region or the fluorine injected region is disposed between a first sidewall and a second sidewall, the first sidewall is formed on the insulating layer and disposed from the insulating layer to the source, and the second sidewall is formed on the insulating layer and disposed from the insulating layer to the drain.

* * * * *